(12) United States Patent
Lee et al.

(10) Patent No.: US 9,182,858 B2
(45) Date of Patent: Nov. 10, 2015

(54) METHOD FOR BURYING CONDUCTIVE MESH IN TRANSPARENT ELECTRODE

(75) Inventors: Taik Min Lee, Daejeon (KR); In Young Kim, Daejeon (KR); Jeong Dai Jo, Daejeon (KR); Dong-Soo Kim, Daejeon (KR)

(73) Assignee: KOREA INSTITUTE OF MACHINERY & MATERIALS, Daejeon (KR)

( * ) Notice: Subject to any disclaimer, the term of this patent is extended or adjusted under 35 U.S.C. 154(b) by 406 days.

(21) Appl. No.: 13/533,127

(22) Filed: Jun. 26, 2012

(65) Prior Publication Data

US 2013/0031781 A1 Feb. 7, 2013

(30) Foreign Application Priority Data

Aug. 2, 2011 (KR) .................. 10-2011-0076817

(51) Int. Cl.
| | |
|---|---|
| *H05K 3/10* | (2006.01) |
| *G06F 3/044* | (2006.01) |
| *G06F 3/045* | (2006.01) |
| *H01L 31/0224* | (2006.01) |
| *H01R 43/04* | (2006.01) |
| *H05K 3/12* | (2006.01) |
| *G02F 1/1343* | (2006.01) |

(52) U.S. Cl.
CPC .............. *G06F 3/044* (2013.01); *G06F 3/045* (2013.01); *H01L 31/022466* (2013.01); *G02F 1/13439* (2013.01); *H01R 43/04* (2013.01); *H05K 3/1275* (2013.01); *H05K 2201/09681* (2013.01); *H05K 2203/0113* (2013.01); *H05K 2203/0534* (2013.01); *Y10T 29/49217* (2015.01)

(58) Field of Classification Search
CPC ......... G06F 3/044; G06F 3/045; H05K 3/101; Y10T 29/49217
USPC ......... 29/592.1, 825, 829, 846; 430/321, 319; 174/257
See application file for complete search history.

(56) References Cited

U.S. PATENT DOCUMENTS

| | | | |
|---|---|---|---|
| 4,054,897 A | 10/1977 | Fukuda | |
| 4,314,231 A | 2/1982 | Walty | |
| 5,135,606 A * | 8/1992 | Kato et al. | 216/20 |
| 5,168,624 A * | 12/1992 | Shirai | 29/846 |
| 5,948,200 A * | 9/1999 | Nakazawa et al. | 156/248 |
| 6,090,484 A * | 7/2000 | Bergerson | 428/355 EN |
| 6,200,405 B1 * | 3/2001 | Nakazawa et al. | 156/248 |
| 6,717,048 B2 * | 4/2004 | Ueda et al. | 174/389 |
| 7,331,286 B2 * | 2/2008 | Baek et al. | 101/170 |
| 7,419,708 B2 * | 9/2008 | Kobayashi et al. | 428/32.51 |
| 7,781,156 B2 * | 8/2010 | Yoo et al. | 430/325 |
| 7,864,507 B2 | 1/2011 | Fleig et al. | |
| 8,347,493 B2 * | 1/2013 | Taniguchi et al. | 29/832 |

(Continued)

FOREIGN PATENT DOCUMENTS

| | | |
|---|---|---|
| JP | 05-295331 | 11/1993 |
| JP | 06-162829 | 6/1994 |

(Continued)

*Primary Examiner* — Peter DungBa Vo
*Assistant Examiner* — Kaying Kue
(74) *Attorney, Agent, or Firm* — Lex IP Meister, PLLC

(57) ABSTRACT

The present invention relates to a method for burying a conductive mesh in a transparent electrode, and more particularly, to a method which prevents a conductive mesh from protruding from a transparent electrode by burying the conductive mesh in the transparent electrode.

3 Claims, 23 Drawing Sheets

(56) References Cited

U.S. PATENT DOCUMENTS

| | | | |
|---|---|---|---|
| 8,395,059 B2* | 3/2013 | Miyazaki et al. | 174/389 |
| 8,544,167 B2* | 10/2013 | Morita | 29/832 |
| 8,576,359 B2* | 11/2013 | Kim et al. | 349/106 |
| 8,793,868 B2* | 8/2014 | Yamano et al. | 29/841 |
| 2002/0125486 A1* | 9/2002 | Kondo et al. | 257/79 |
| 2003/0013048 A1* | 1/2003 | Gilson | 430/321 |
| 2004/0052982 A1* | 3/2004 | Kobayashi et al. | 428/32.39 |
| 2006/0127610 A1* | 6/2006 | Kobayashi et al. | 428/32.81 |
| 2007/0048667 A1* | 3/2007 | Yoo et al. | 430/302 |
| 2008/0061694 A1* | 3/2008 | Kim | 313/582 |
| 2008/0206673 A1* | 8/2008 | Kawakami et al. | 430/275.1 |
| 2008/0248205 A1* | 10/2008 | Blanchet et al. | 427/282 |
| 2008/0275327 A1* | 11/2008 | Faarbaek et al. | 600/382 |
| 2009/0242255 A1* | 10/2009 | Taniguchi et al. | 174/260 |
| 2010/0024212 A1* | 2/2010 | Okabe et al. | 29/852 |
| 2010/0108371 A1* | 5/2010 | Furutani et al. | 174/260 |
| 2010/0139965 A1* | 6/2010 | Wang et al. | 174/261 |
| 2010/0142170 A1* | 6/2010 | Kim et al. | 361/762 |
| 2010/0157211 A1* | 6/2010 | Kim et al. | 349/106 |
| 2011/0122596 A1* | 5/2011 | Miyazaki et al. | 361/818 |
| 2012/0008287 A1* | 1/2012 | Kim et al. | 361/736 |
| 2012/0063812 A1* | 3/2012 | Ozerov | 399/237 |
| 2012/0086523 A1* | 4/2012 | Meltaus et al. | 333/187 |
| 2012/0260502 A1* | 10/2012 | Yen | 29/846 |
| 2014/0145343 A1* | 5/2014 | Kim et al. | 257/773 |

FOREIGN PATENT DOCUMENTS

| | | |
|---|---|---|
| JP | 08-156388 | 6/1996 |
| JP | 10-049051 | 2/1998 |
| JP | 3237055 | 10/2001 |
| JP | 2004-111822 | 4/2004 |
| JP | 2004-303914 | 10/2004 |
| JP | 2005-175061 | 6/2005 |
| JP | 2008-260227 | 10/2008 |
| JP | 2009-238851 | 10/2009 |
| JP | 4405196 | 11/2009 |
| JP | 2010-266734 | 11/2010 |
| JP | 2011-096975 | 5/2011 |
| JP | 2011-141652 | 7/2011 |
| KR | 10-2001-0030442 | 4/2001 |
| KR | 10-2001-0046470 | 6/2001 |
| KR | 10-0581857 | 6/2004 |
| KR | 10-2007-0008454 | 1/2007 |
| KR | 10-0902561 | 6/2009 |
| KR | 10-2010-0094851 | 8/2010 |
| KR | 10-2010-0096645 | 9/2010 |
| KR | 10-1022015 | 3/2011 |

* cited by examiner

METHOD FOR BURYING CONDUCTIVE MESH IN TRANSPARENT ELECTRODE

CROSS-REFERENCE TO RELATED APPLICATION

This application claims priority to and the benefit of Korean Patent Application No. 10-2011-0076817 filed in the Korean Intellectual Property Office on Aug. 2, 2011, the entire contents of which are incorporated herein by reference.

BACKGROUND OF THE INVENTION (a) Field of the Invention

The present invention relates to a method for burying a conductive mesh in a transparent electrode, and more particularly, to a method which prevents a conductive mesh from protruding from a transparent electrode by burying the conductive mesh in the transparent electrode.

(b) Description of the Related Art

Generally, a transparent conductive film is used for plasma display panels (PDPs), liquid crystal displays (LCDs), light emitting diodes (LEDs), organic electroluminescent devices (OLEDs), touch panels, solar cells, etc.

Because the transparent electrode has high conductivity and high transmittance in the visible light range, it may be used as the electrode of not only solar cells, LCDs and PDPs but also of various light-receiving devices and light-emitting devices, and as well, as a transparent electromagnetic wave shield, including an antistatic film or an electromagnetic wave shielding film, for use in automobile window glass or building window glass, and a transparent heat generator for a heat reflection film or a freezing showcase.

As the above-described transparent electrode, ITO is widely used.

Although ITO, having superior general properties, is mainly applied to the process to date, indium oxide ($In_2O_3$) is produced as a by-product in a zinc (Zn) mine, and problems of instable supply and unmet demand arise.

Further, the ITO film is not flexible and thus cannot be used as a flexible material for a polymer substrate, and furthermore, because it is manufactured under conditions of high temperature and high pressure, the production cost thereof is undesirably high.

To solve this problem, as shown in FIG. 1, techniques for forming a conductive material in a mesh form (hereinafter, referred to as a conductive mesh) M on an organic polymer electrode (hereinafter, referred to as a transparent electrode) 10 by printing or coating are proposed.

However, the above-described conductive mesh M according to a conventional method is formed to protrude on the upper surface of the transparent electrode 10, and its protruding height is not uniform.

Due to this, the contact performance of the transparent electrode 10 is deteriorated, and the conductive mesh M is separated from the transparent electrode 10.

The above information disclosed in this Background section is only for enhancement of understanding of the background of the invention and therefore it may contain information that does not form the prior art that is already known in this country to a person of ordinary skill in the art.

SUMMARY OF THE INVENTION

The present invention has been made in an effort to provide a method for burying a conductive mesh in a transparent electrode, which prevents the conductive mesh from protruding from the transparent electrode by burying the conductive mesh in the transparent electrode, and therefore improves the contact performance of the transparent electrode and prevents the conductive mesh from being separated from the transparent electrode.

An exemplary embodiment of the present invention provides a method for burying a conductive mesh in a transparent electrode, the method including: attaching a conductive mesh to a transfer unit made of PDMS; pressing and tightly adhering the transfer unit to a transparent electrode on a substrate; and separating the transfer unit from the transparent electrode to separate the conductive mesh from the transfer unit and bury the conductive mesh in the transparent electrode to prevent the conductive mesh from protruding from the transparent electrode.

Another embodiment of the present invention provides a method for burying a conductive mesh in a transparent electrode by a mesh burying device including a bed with a plurality of recesses forming a mesh form by crossing each other and a first transfer unit made of PDMS adapted to be in contact with the bed, the method including: filling a liquid conductive mesh in the recesses of the bed; bringing the first transfer unit into contact with the bed; separating the contacted bed and first transfer unit from each other to transfer the conductive mesh filled in the recesses of the bed to the first transfer unit; tightly adhering the first transfer unit to a substrate having the transparent electrode and burying the conductive mesh attached to the first transfer unit in the transparent electrode; and separating the first transfer unit from the substrate having the transparent electrode, with the conductive mesh being buried in the transparent electrode so as not to protrude from the transparent electrode.

Yet another embodiment of the present invention provides a method for burying a conductive mesh in a transparent electrode by a mesh burying device including a bed with a plurality of recesses forming a mesh form by crossing each other, a first transfer unit made of PDMS adapted to be in contact with the bed, and a second transfer unit made of PDMS adapted to be in contact with the first transfer unit, and having a lower contact force than the first transfer unit, the method including: filling a liquid conductive mesh in the recesses of the bed; bringing the first transfer unit into contact with the bed; separating the first transfer unit being in contact with the bed from the bed to transfer the conductive mesh filled in the recesses of the bed to the first transfer unit; tightly adhering the first transfer unit to the second transfer unit having the transparent electrode and burying the conductive mesh attached to the first transfer unit in the transparent electrode so as not to protrude from the transparent electrode; separating the first transfer unit from the second transfer unit to separate the transparent electrode with the conductive mesh buried therein, being attached to the first transfer unit, from the second transfer unit; and bringing the first transfer unit, to which the transparent electrode with the conductive mesh buried therein is attached, into contact with a substrate and separating the first transfer unit from the substrate to attach the transparent electrode with the conductive mesh buried therein to the substrate.

A further embodiment of the present invention provides a method for burying a conductive mesh in a transparent electrode by a gravure offset printing machine including a pattern roller with a plurality of recesses forming a mesh form by crossing each other, a blanket roller having a blanket made of PDMS adapted to be in contact with the pattern roller, and an impression roller to be brought into contact with the blanket roller, with a substrate interposed therebetween, the method including: filling a liquid conductive mesh in the recesses of the pattern roller; bringing the blanket roller into contact with the pattern roller to transfer the conductive mesh to the blanket roller; and passing the substrate applied with the transparent electrode between the blanket roller and the impression roller, wherein, in the passing of the substrate between the blanket roller and the impression roller, the blanket roller and the substrate are brought into contact with each other so that the conductive mesh transferred to the blanket roller is buried in the transparent electrode on the substrate without protruding from the transparent electrode.

A further embodiment of the present invention provides a method for burying a conductive mesh in a transparent electrode by a reverse gravure offset printing machine including a cliche with a plurality of protrusions forming a mesh form by crossing each other, a base applied with the conductive mesh in liquid form, and a roller for transferring the conductive mesh to a substrate applied with the transparent electrode, the method including: applying a liquid conductive mesh to the base; bringing the roller into contact with the base to transfer the conductive mesh to the roller; bringing the roller into contact with the cliche to transfer unnecessary portions of the conductive mesh to the protrusions; and bringing the roller, by which the unnecessary portions of the conductive mesh are removed, into contact with the substrate applied with the transparent electrode, so that the conductive mesh transferred to the roller is buried in the transparent electrode on the substrate.

A further embodiment of the present invention provides a method for burying a conductive mesh in a transparent electrode by a flatbed offset printing machine including a flatbed with a plurality of pattern recesses forming a mesh form by crossing each other and a roller adapted to be brought into contact with the flatbed to transfer the conductive mesh to a substrate, the method including: applying the conductive mesh to the flatbed; filling the conductive mesh in the pattern recesses of the flatbed by a doctor blade; bringing the roller into contact with the flatbed to transfer the conductive mesh filled in the pattern recesses of the flatbed to the roller; and bringing the roller into contact with the substrate applied with the transparent electrode so that the conductive mesh transferred to the roller is buried in the transparent electrode on the substrate.

According to an embodiment of the present invention, the contact performance of the transparent electrode is improved because the conductive mesh does not protrude from the transparent electrode, and the conductive mesh is firmly fixed to the transparent electrode.

Figure 1:
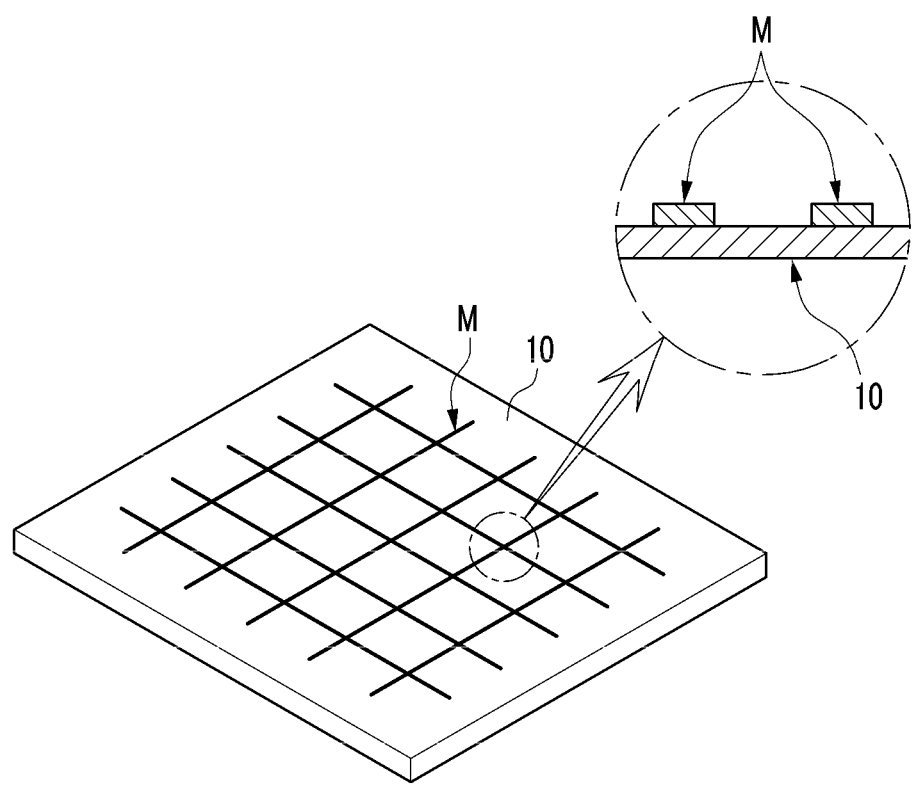
FIG. 1 is a schematic diagram showing a conductive mesh protruding on a transparent electrode in the conventional art.
Figure 2A:
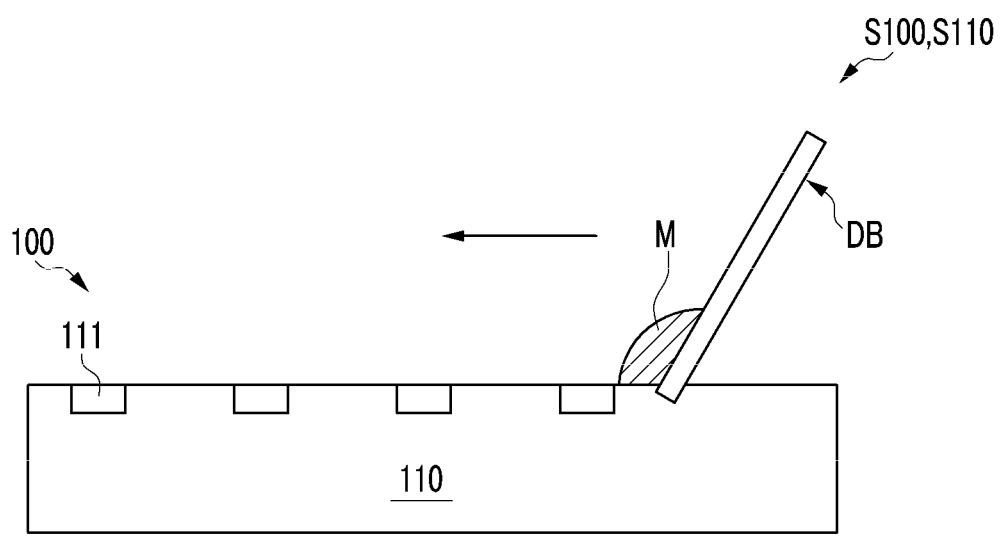
FIG. 2A to 2E are schematic diagrams showing a method of an embodiment of the present invention.
Figure 2B:
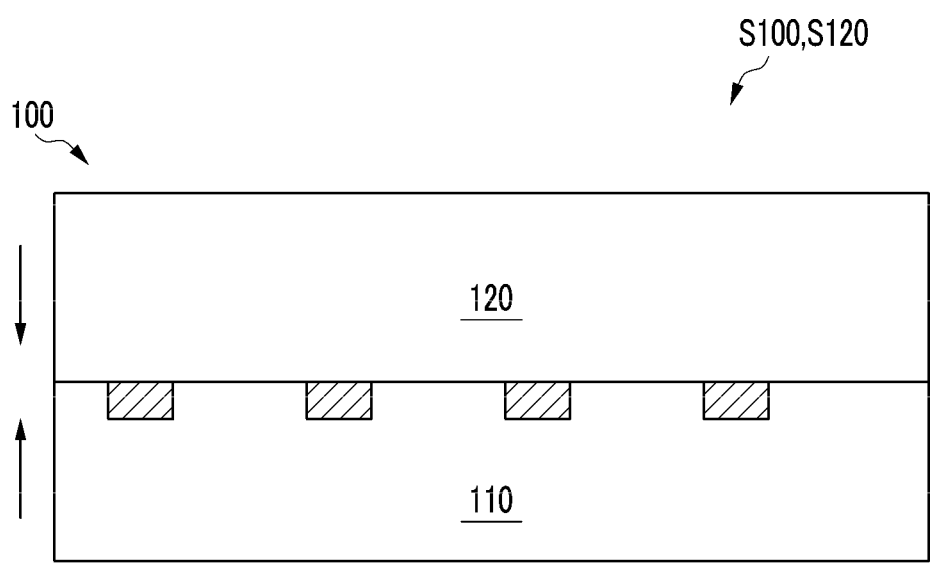
Figure 2C:
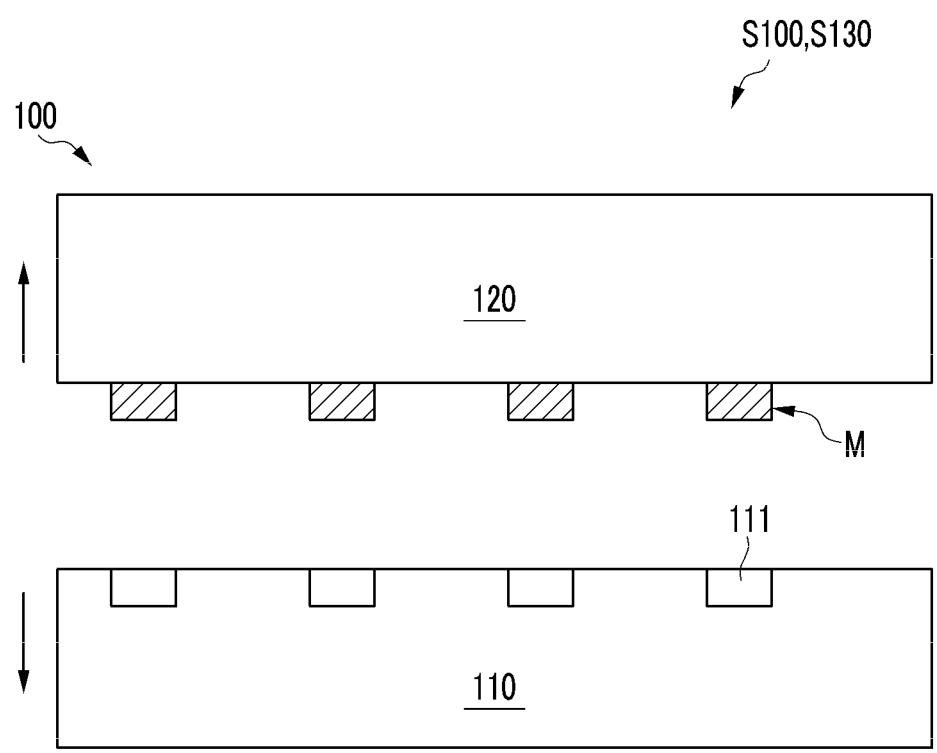
Figure 2D:
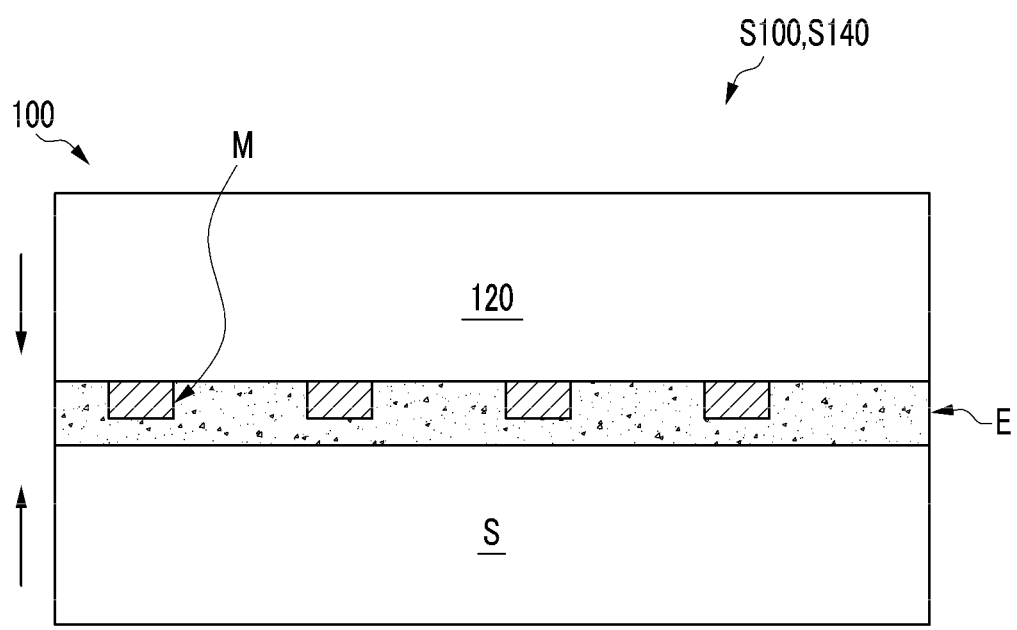
Figure 2E:
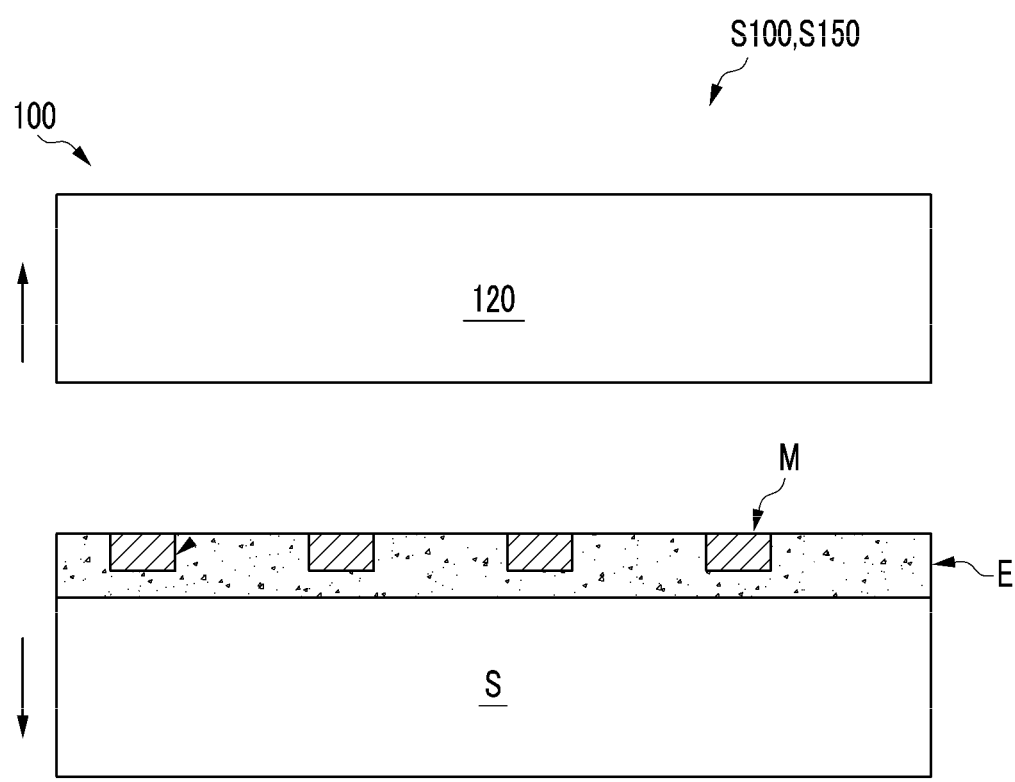

| Description of Reference Numerals Indicating Primary Elements in the Drawings | |
|---|---|
| 100, 200: mesh burying device | 110, 210: bed |
| 120, 220: first transfer unit | 230: second transfer unit |
| E: transparent electrode | S: substrate |
| 300: gravure offset printing machine | |
| 500: reverse gravure printing machine | |
| 600: flatbed printing machine | |

DETAILED DESCRIPTION OF THE EMBODIMENTS

Before explaining the current examples of the present modular outdoor playpen apparatus in detail, it is to be understood that the invention is not limited in its application to the details of construction and arrangements of the components set forth in the following description or illustration.

The invention is capable of other examples and of being practiced and carried out in various ways.

Also, it is to be understood that phraseology and terminology used herein with reference to device or element orientation (such as, for example, terms like "front", "back", "up", "down", "top", "bottom", "left", "lateral", and the like) are only used to simplify description of the present invention, and do not alone indicate or imply that the device or element referred to must have a particular orientation.

Hereinafter, an exemplary embodiment of the present invention will be described in detail with reference to the accompanying drawings. Prior to making the description, the terms or words used in the specification and claims of the present invention are not interpreted using typical or dictionary limited meanings, and are constructed as meanings and concepts conforming to the technical spirit of the present invention based on the principle that the inventors can appropriately define the concepts of the terms to explain the present invention in the best manner.

Accordingly, it is to be understood that the detailed description, which will be disclosed along with the accompanying drawings, is intended to describe the exemplary embodiments of the present invention and is not intended to represent all technical ideas of the present invention. Therefore, it should be understood that various equivalents and modifications can exist which can replace the embodiments described in the time of the application.

Hereinafter, the present invention will be described in detail with reference to FIG. 2 and an exemplary embodiment.

As described above, the present invention involves a method for burying a conductive mesh in a transparent electrode to prevent the conductive mesh from protruding from the transparent electrode, the method including: attaching a conductive mesh to a transfer unit made of PDMS; and pressing and tightly adhering the transfer unit to a transparent electrode on a substrate, and separating the transfer unit from the transparent electrode to separate the conductive mesh from the transfer unit and bury the conductive mesh in the transparent electrode.

In other words, when the conductive mesh is pressed onto a plate-like transparent electrode and enters the transparent electrode to be buried therein, the conductive mesh is buried without protruding from the transparent.

The present invention having this configuration will be described in the following exemplary embodiments.

Exemplary Embodiment 1

As shown in FIGS. 2A to 2E, the embodiment of the present invention involves a method S100 for burying a conductive mesh M in a transparent electrode E by using a mesh burying device 100 including a bed 110 with a plurality of recesses 111, serving as molds of the conductive mesh M buried in the transparent electrode E and forming a mesh form by crossing each other, and a first transfer unit 120 made of PDMS adapted to be in contact with the bed 110.

To this end, first of all, the step S110 (hereinafter, referred to as the eleventh step) of filling a liquid conductive mesh M in the recesses 111 of the bed 110 is carried out. (see FIG. 2A)

In the eleventh step S110, a liquid conductive mesh may be poured onto the bed 110 by a dispenser (not shown), and then the liquid conductive mesh M may be filled in the recesses 111 of the bed 110 by using a doctor blade DB.

Afterwards, the step S120 (hereinafter, referred to as the twelfth step) of bringing the first transfer unit 120 into contact with the bed 110 is carried out. The first transfer unit 120 of the twelfth step may be made of PDMS. (see FIG. 2B)

PDMS stamps (polydimethylsiloxane stamps) have the characteristics of being stably adhered to a wide area of a substrate and capable of adjusting surface free energy.

Using these characteristics, the above-mentioned conductive mesh M can be easily transferred to the first transfer unit 120 or to other components from the first transfer unit 120.

Since this has been widely known, a detailed description thereof will be omitted here.

After carrying out the twelfth step S120, the step S130 (hereinafter, referred to as the thirteenth step) of separating the contacted bed 110 and first transfer unit 120 from each other to transfer the conductive mesh M filled in the recesses 111 of the bed 110 to the first transfer unit 120 is carried out. (see FIG. 2C)

In the thirteenth step S130, the conductive mesh M is transferred to the first transfer unit 120 by the use of a surface energy difference between the first transfer unit 120 and the bed 110, as described above.

After carrying out the thirteenth step S130, the step S140 (hereinafter, referred to as the fourteenth step) of tightly adhering the first transfer unit 120 to a substrate S having a transparent electrode E and burying the conductive mesh M attached to the first transfer unit 120 in the transparent electrode E is carried out. (see FIG. 2D)

By the fourteenth step S140, the conductive mesh M can be buried in the transparent electrode E without protruding from the transparent electrode E.

Afterwards, the transparent electrode E having the buried conductive mesh M is mounted on the substrate S by the step S150 of separating the first transfer unit 120 from the substrate S. (see FIG. 2E)

Conventionally, as shown in FIG. 1, the conductive mesh M has a shape that protrudes from the transparent electrode 10.

This shape causes the problem of deterioration of the contact performance of the transparent electrode 10 and separation of the conductive mesh M from the transparent electrode 10.

The embodiment of the present invention aims to solve this problem by burying the conductive mesh M in the transparent electrode to prevent the conductive mesh M from protruding from the transparent electrode E. Consequently, the contact performance of the transparent electrode is improved, and the conductive mesh is not separated from the transparent electrode but instead firmly attached thereto.

After carrying out the fourteenth step S140, the step S150 (hereinafter, referred to as the fifteenth step) of separating the first transfer unit 120 and the substrate S to separate the conductive mesh M, being buried in the transparent electrode E, from the first transfer unit 120 is carried out, thereby completing the process.

Meanwhile, the transparent electrode E is formed on the substrate S. To this end, the transparent electrode E may be applied to the substrate S by spin coating or slit coating. Since this is a widely known technique, a detailed description thereof is omitted.

Exemplary Embodiment 2

As shown in FIGS. 3A to 3I, the embodiment of the present invention involves a method S200 for burying a conductive mesh M in a transparent electrode E by using a mesh burying device 200 including a bed 210 with a plurality of recesses 211, serving as molds of the conductive mesh M buried in the transparent electrode E and forming a mesh form by crossing each other, a first transfer unit 220 made of PDMS adapted to be in contact with the bed 210, and a second transfer unit 230 made of PDMS adapted to be in contact with the first transfer unit 220, and having a lower contact force than the first transfer unit 220.

To this end, first of all, the step S210 (hereinafter, referred to as the twenty-first step) of filling a liquid conductive mesh M in the recesses 211 of the bed 210 is carried out. (see FIG. 3A)

The twenty-first step S210 is identical to the eleventh step S110 of Exemplary Embodiment 1, so redundant description will be omitted.

After carrying out the twenty-first step S210, the step S220 (hereinafter, referred to as the twenty-second step) of bringing the first transfer unit 220 into contact with the bed 210 and the step S230 (hereinafter, referred to as the twenty-third step) of separating the contacted bed 210 and first transfer unit 220 from each other to transfer the conductive mesh M filled in the recesses 211 of the bed 210 to the first transfer unit 220 are carried out. (see FIG. 3B and FIG. 3C)

The twenty-second step S220 and the twenty-third step S230 are identical to the twelfth step S120 and thirteenth step S130 of Exemplary Embodiment 1, redundant description will be omitted.

After carrying out the twenty-second step S220 and the twenty-third step S230, the step S240 (hereinafter, referred to as the twenty-fourth step) of tightly adhering the first transfer unit 220 to the second transfer unit 230 having a transparent electrode E and burying the conductive mesh M attached to the first transfer unit 220 in the transparent electrode E is carried out. (see FIG. 3E and FIG. 3F)

Figure 3A:
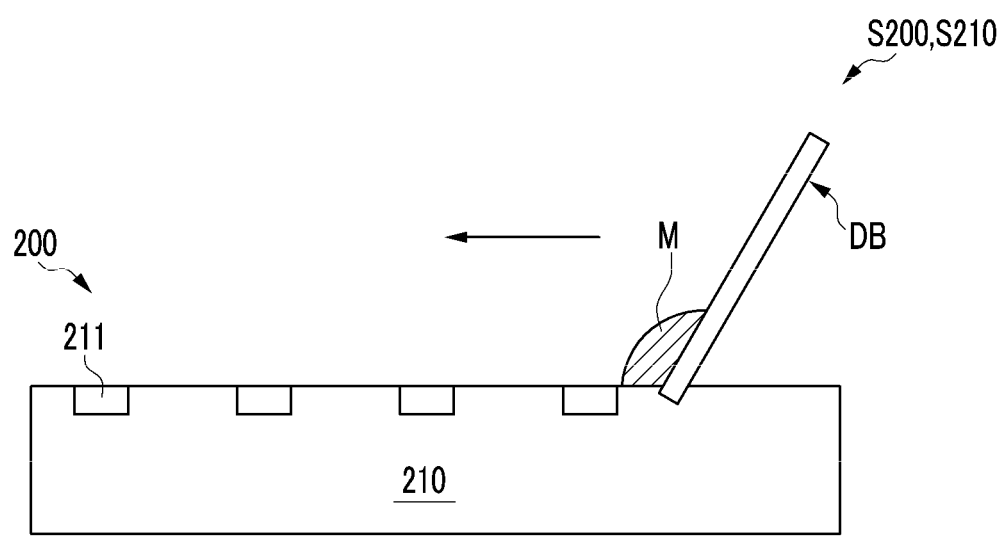
FIG. 3A to 3I are schematic diagrams showing a method of the other embodiment of the present invention.
Figure 3B:
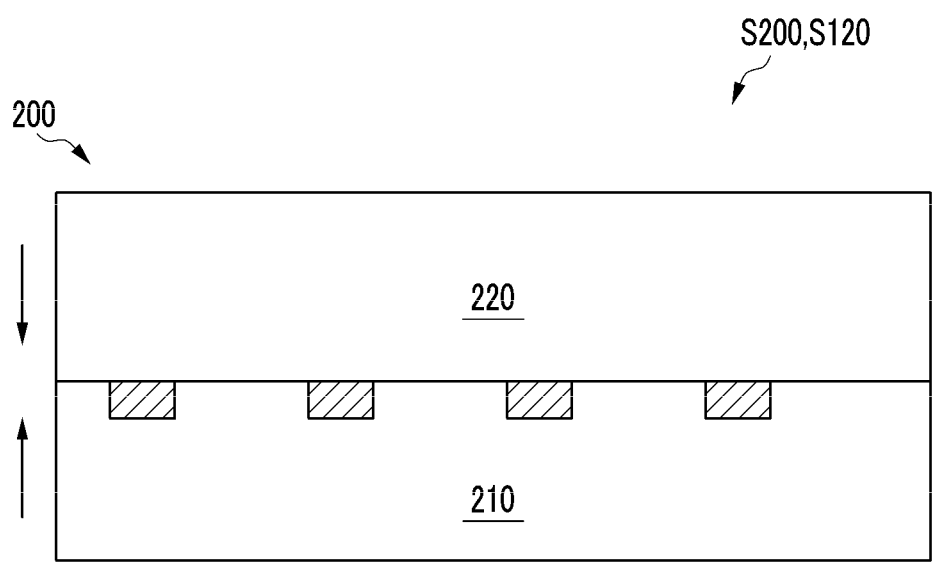
Figure 3C:
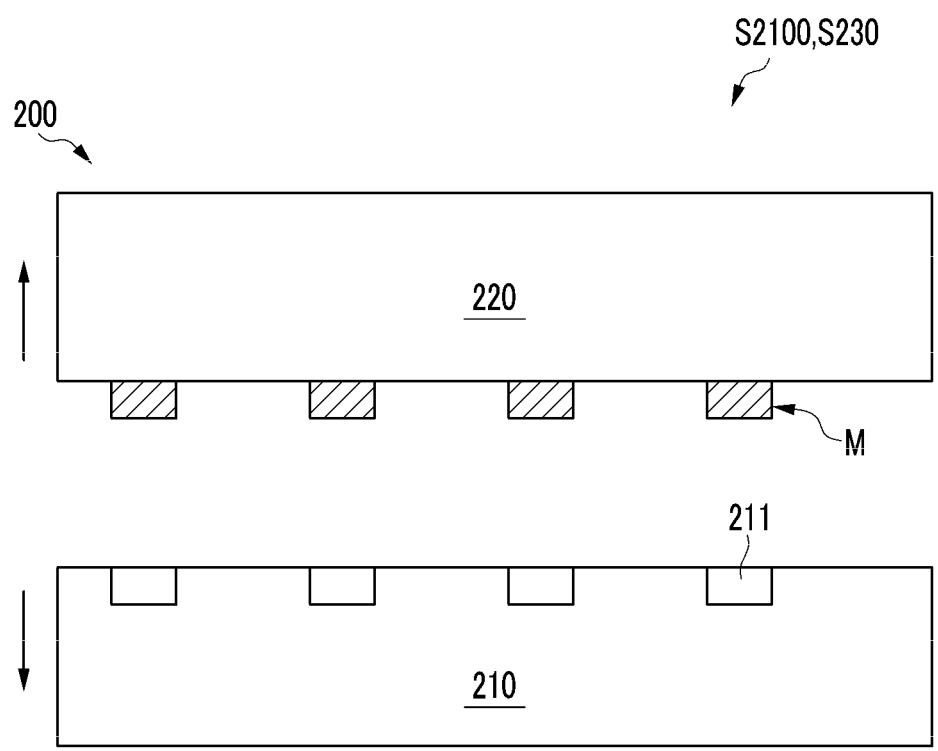
Figure 3D:
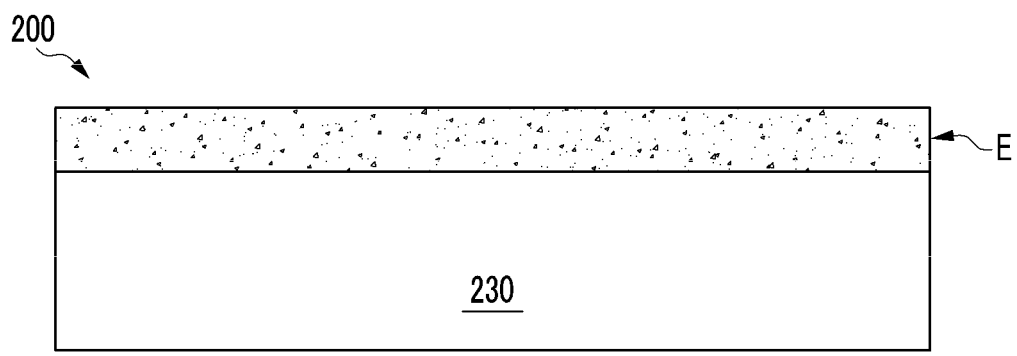
Figure 3E:
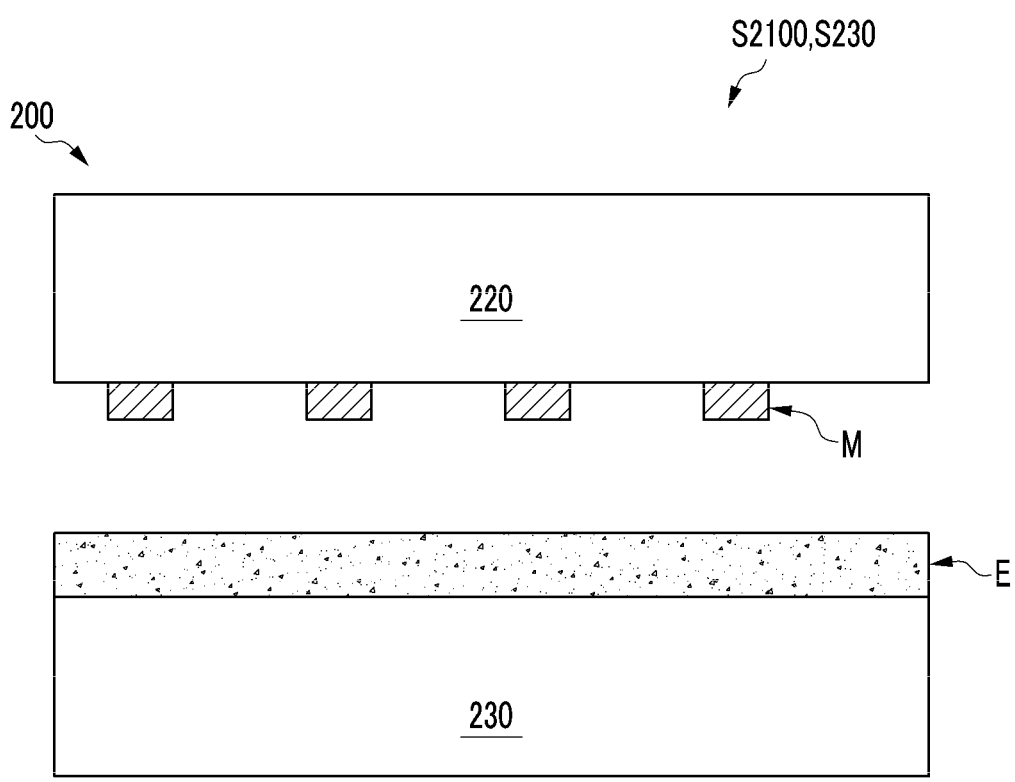
Figure 3F:
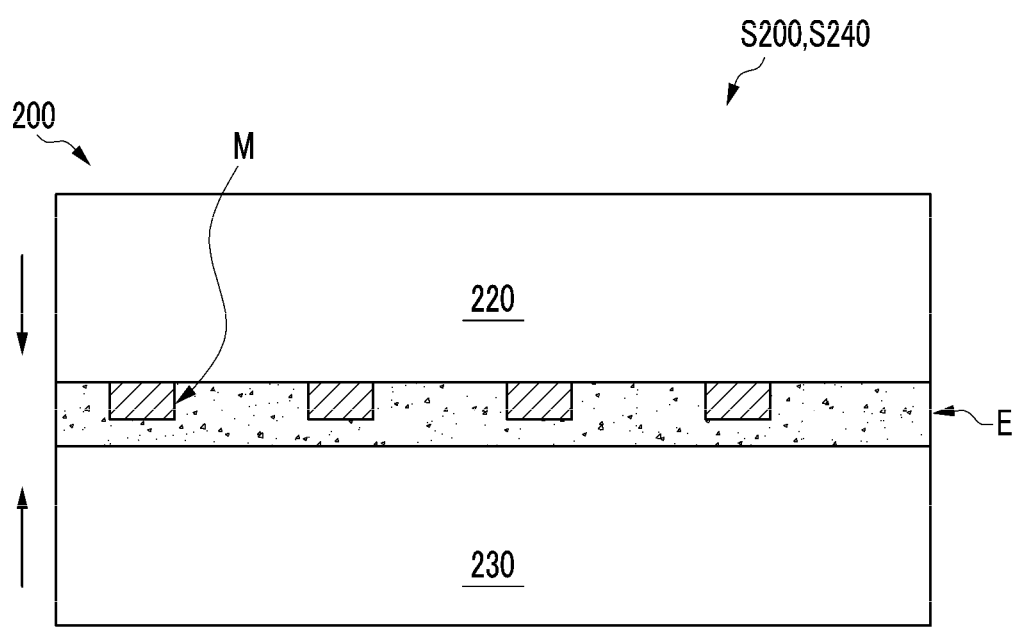
Figure 3G:
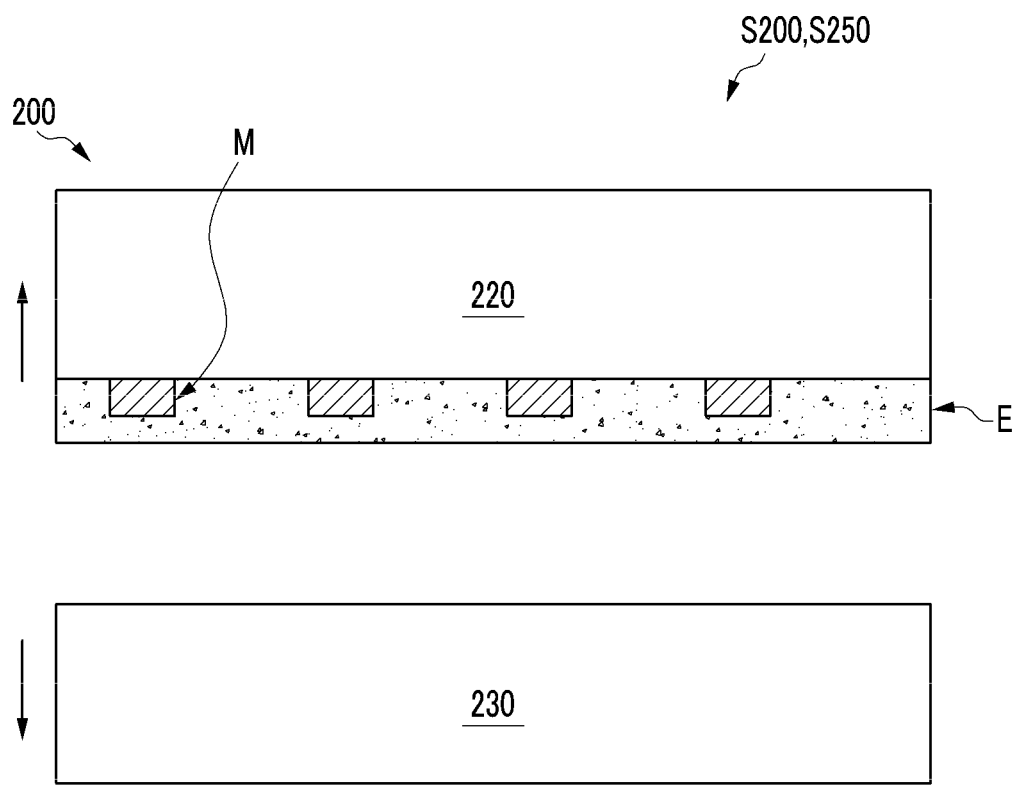
Figure 3H:
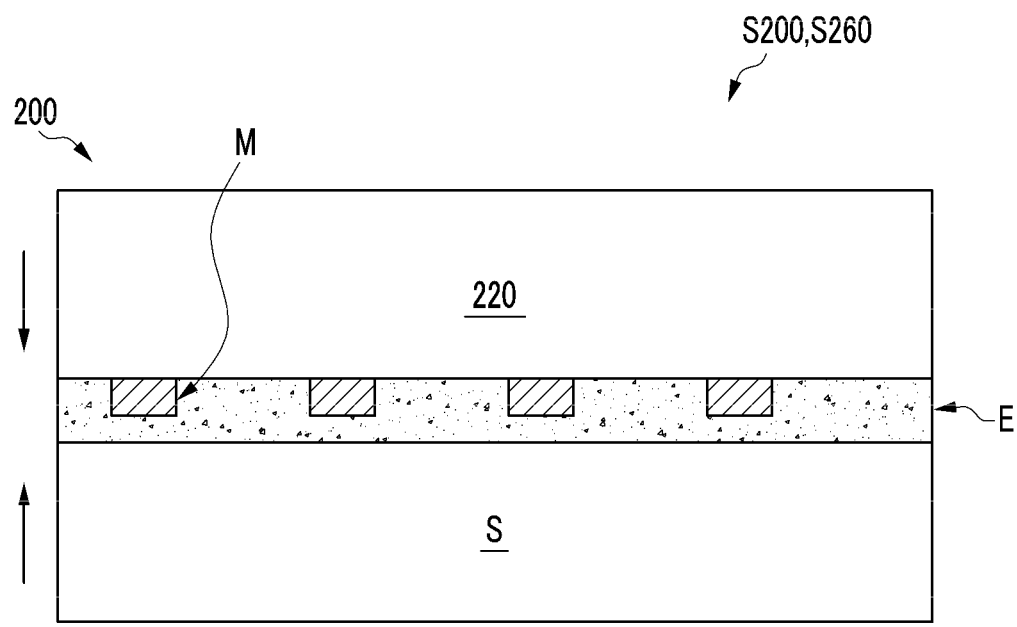

At this point, as shown in FIG. 3D, the transparent electrode E is applied to the second transfer unit 230. To this end, spin coating, slit coating, etc. may be used as explained above.

The second transfer unit 230 is made of a PDMS having a lower contact force than the first transfer unit 220, as described above.

Thereby, the conductive mesh M is transferred from the first transfer unit 220 to the second transfer unit 230.

By the twenty-fourth step S240, the conductive mesh M enters the transparent electrode E, and the conductive mesh M is buried therein without protruding from the transparent electrode E. (see FIG. 3F)

After carrying out the twenty-fourth step S240, the step S250 (hereinafter, referred to as the twenty-fifth step) of separating the first transfer unit 220 and the second transfer unit 230 to separate the transparent electrode E with the conductive mesh M buried therein, being attached to the first transfer unit 220, from the second transfer unit 230 is carried out. (see FIG. 3G)

The twenty-fifth step S250 is carried out by taking advantage of the characteristic that first transfer unit 220 and the second transfer unit 230 have different contact forces.

After carrying out the twenty-fifth step S250, the step S260 (hereinafter, referred to as the twenty-sixth step) of bringing the first transfer unit 220 into contact with the substrate S and separating the first transfer unit 220 from the substrate S to attach the transparent electrode E with the conductive mesh M buried therein to the substrate S is carried out. (see FIG. 3H)

Figure 3I:
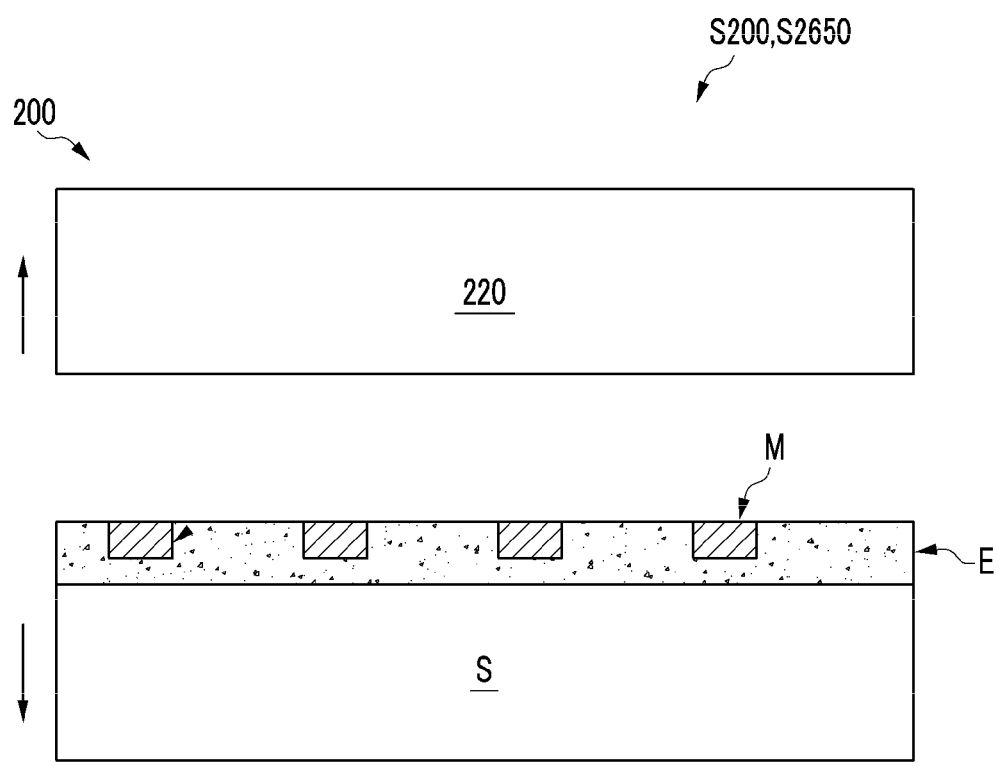

Afterwards, as shown in FIG. 3I, the first transfer unit 220 is separated from the substrate S, thereby completing the process, with the transparent electrode E being attached to the substrate S.

Exemplary Embodiment 3

Figure 4:
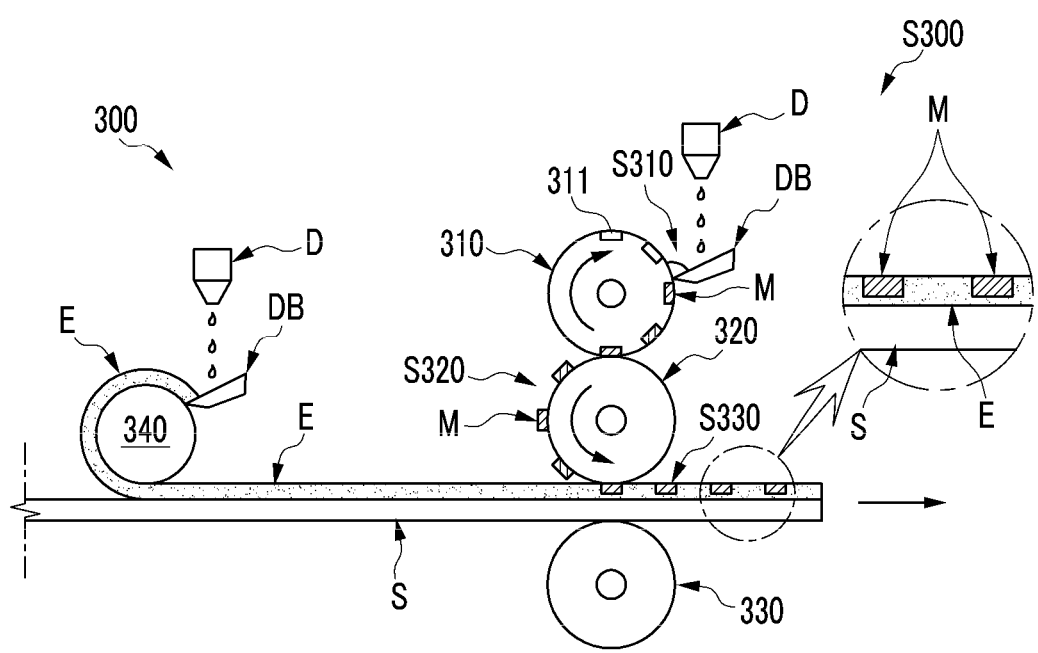
FIG. 4 is a schematic diagram showing a method of another embodiment of the present invention using a gravure offset printing machine.

As shown in FIG. 4, the embodiment of the present invention provides a method S300 of burying a conductive mesh M in a transparent electrode E by a gravure offset printing machine 300.

That is, the embodiment of the present invention provides a method S300 of burying a conductive mesh M in a transparent electrode E by a gravure offset printing machine 300, the gravure offset printing machine 300 including a pattern roller 310 with a plurality of recesses 311, serving as molds of the conductive mesh M buried in the transparent electrode E and forming a mesh form by crossing each other, a blanket roller 320 having a blanket 321 made of PDMS adapted to be in contact with the pattern roller 310, and an impression roller 330 to be brought into contact with the blanket roller 320, with a substrate S interposed therebetween.

To this end, first of all, the step S310 (hereinafter, referred to as the thirty-first step) of filling a liquid conductive mesh M in the recesses 311 of the pattern roller 310 is carried out.

The thirty-first step S310 may be carried out by using a dispenser D for ejecting the liquid conductive mesh M and a doctor blade DB for uniformly applying the liquid conductive mesh M. Since this is widely known, a detailed description thereof will be omitted.

Meanwhile, the recesses 311 may be formed in the blanket (not shown) made of PDMS that covers the periphery of the pattern roller 310.

After carrying out the thirty-first step S310, the step S320 (hereinafter, referred to as the thirty-second step) of brining the blanket roller 320 into contact with the pattern roller 310 to transfer the conductive mesh M to the blanket roller 320 is carried out.

At this point, the above-described blanket (not shown) made of PDMS may be installed on the outer circumference of the blanket roller 320 to transfer the conductive mesh M in the thirty-second step S320.

After carrying out the thirty-second S320, the step S330 (hereinafter, referred to as the thirty-third step) of passing the substrate S applied with the transparent electrode E between the blanket roller 320 and the impression roller 330 is carried out. In the thirty-third step, the blanket roller 320 and the substrate S are brought into contact with each other so that the conductive mesh M transferred to the blanket roller 320 is buried in the transparent electrode E of the substrate S without protruding from the transparent electrode E.

A dispenser D, a doctor blade Db, and a roller 340 may be provided to apply the transparent electrode E to the substrate S (see the left part of FIG. 4).

At this point, the transparent electrode E may be formed on the substrate S, as illustrated in the drawing, by applying a liquid transparent electrode E to the roller 340 by the dispenser D and then bringing the roller 340 and the substrate into contact with each other.

Figure 5:
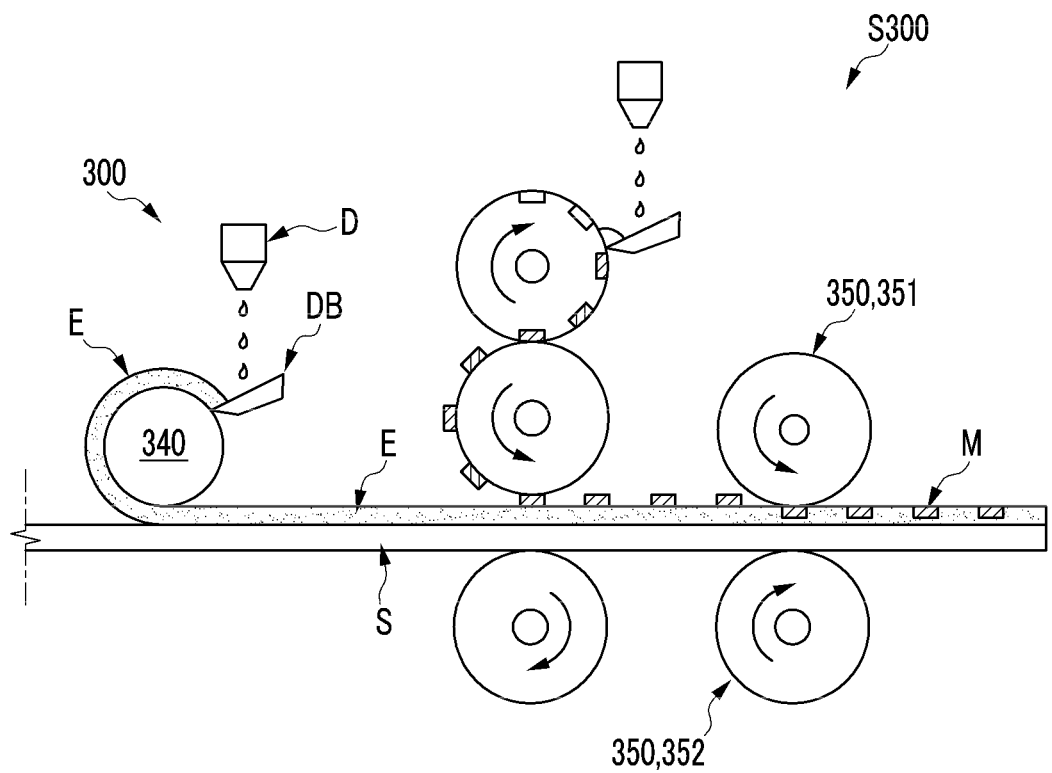
FIG. 5 is a schematic diagram showing a method of another embodiment of the present invention using a gravure offset printing machine.

In the present invention, the conductive mesh M may be pressed by the blanket roller 320 and buried in the transparent electrode E by bringing the blanket roller 320 and the transparent electrode E into contact with each other, as shown in FIG. 4, or the conductive mesh M may be buried in the transparent electrode E by attaching the conductive mesh M to protrude from the transparent electrode E and pressing the conductive mesh M by rollers 350; 351, and 352, as shown in FIG. 5.

Exemplary Embodiment 4

Figure 6A:
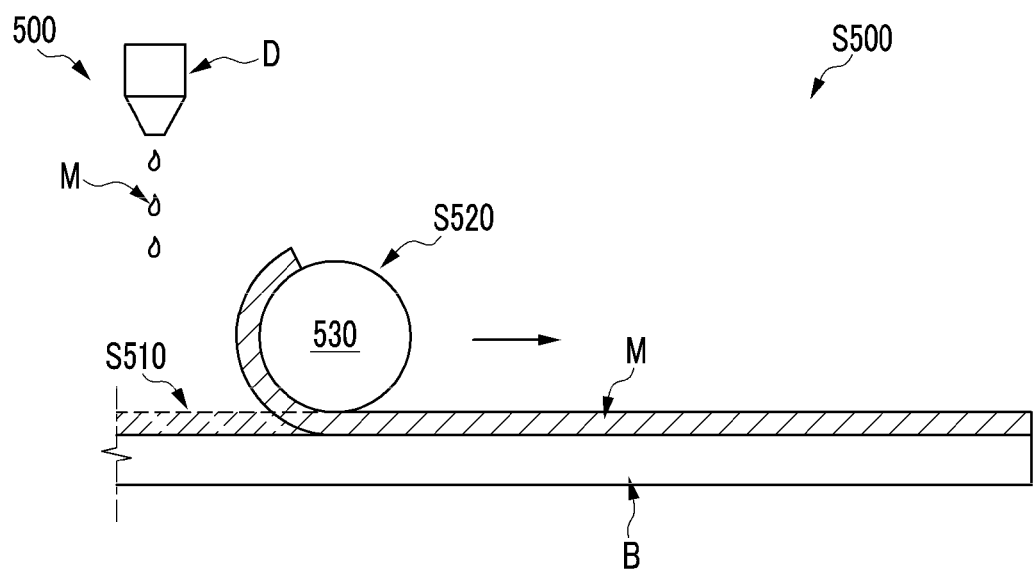
FIG. 6A to 6C are schematic diagrams showing a method of another embodiment the present invention using a reverse gravure offset printing machine.
Figure 6B:
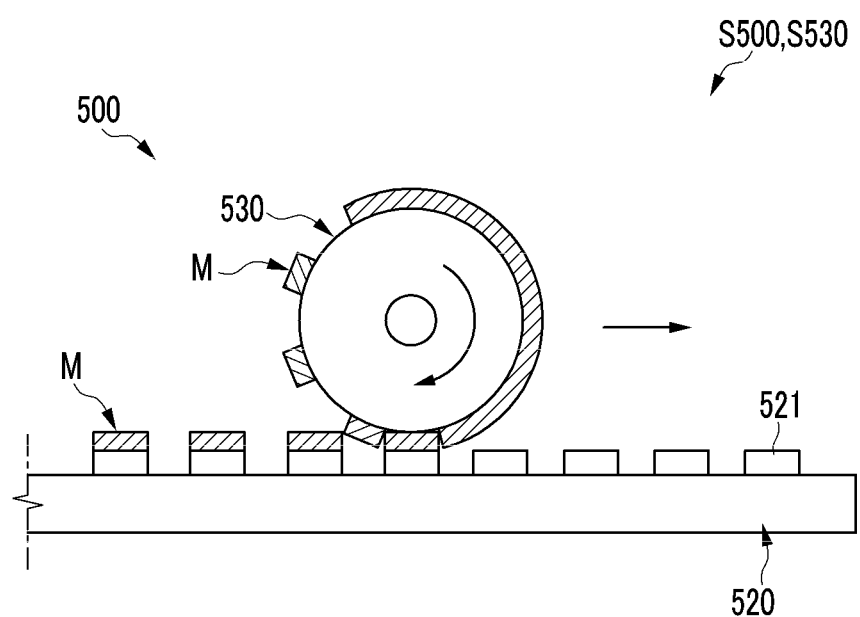
Figure 6C:
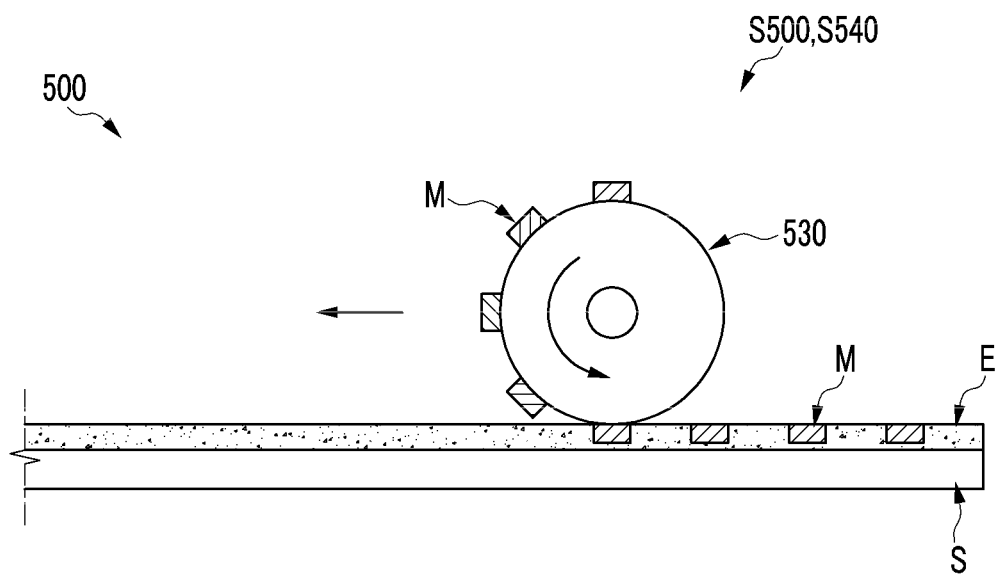

As shown in FIGS. 6A to 6C, the embodiment of the present invention provides a method S500 of burying a conductive mesh M in a transparent electrode E by a reverse gravure offset printing machine 500.

That is, the embodiment of the present invention provides a method S500 of burying a conductive mesh M in a transparent electrode E by a reverse gravure offset printing machine 500, the reverse gravure offset printing machine 500 including a cliche 520 with a plurality of protrusions 521, serving as molds of the conductive mesh M buried in the transparent electrode E and forming a mesh form by crossing each other, a base B applied with the conductive mesh M in liquid form, and a roller 530 for transferring the conductive mesh M to the substrate S applied with the transparent electrode E.

To this end, first of all, the step S510 (hereinafter, referred to as the fifty-first step) of applying a liquid conductive mesh M to a base B and the step of (hereinafter, referred to as the fifty-second step) of bringing the roller 530 into contact with the base B to transfer the conductive mesh M to the roller 530 are carried out (see FIG. 6A).

In the fifty-first step S510, the conductive mesh M may be applied by spin coating or slit coating, as described above.

After carrying out the fifty-first step S510 and the fifty-second step S520, the step S530 (hereinafter, referred to as the fifty-third step) of bringing the roller 530 into contact with the cliche 520 to transfer unnecessary portions of the conductive mesh M to the protrusions 521 are carried out.

By the fifty-third step S530, only a mesh of a desired shape remains on the roller 530.

After carrying out the fifty-third step S530, the step S540 (hereinafter, referred to as the fifty-fourth step) of bringing the roller 530, by which the unnecessary portions of the conductive mesh M are removed, into contact with the substrate S applied with the transparent electrode E is carried out. In the fifty-fourth step, the conductive mesh M transferred to the roller 530 is buried in the transparent electrode E on the substrate S.

To this end, the roller 530 may be brought into contact with the transparent electrode E so that the conductive mesh M is pressed by the roller 530 and buried in the transparent electrode E.

Exemplary Embodiment 5

Figure 7A:
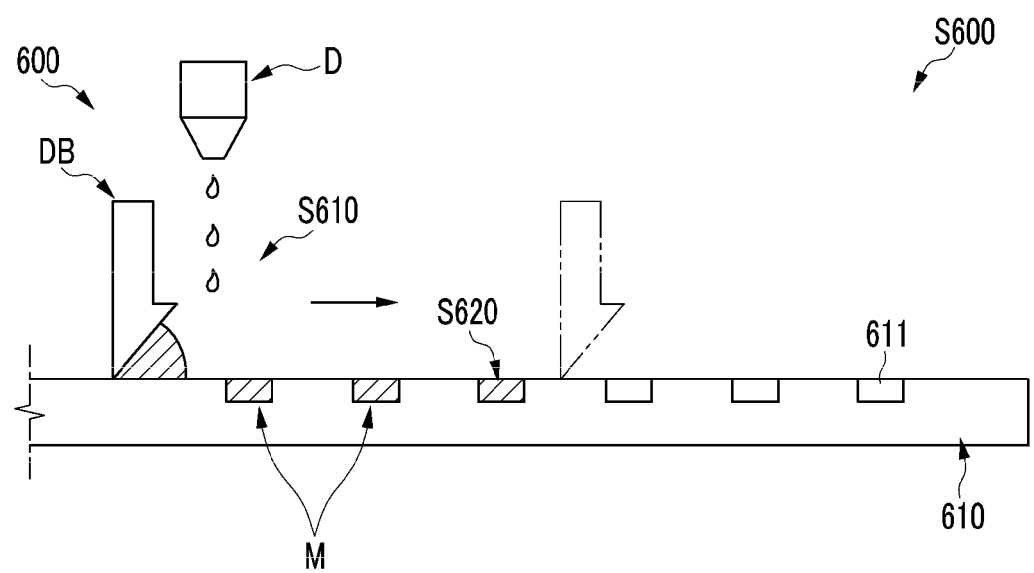
FIG. 7A to 7C are schematic diagrams showing a method of an embodiment the present invention using a flatbed printing machine.
Figure 7B:
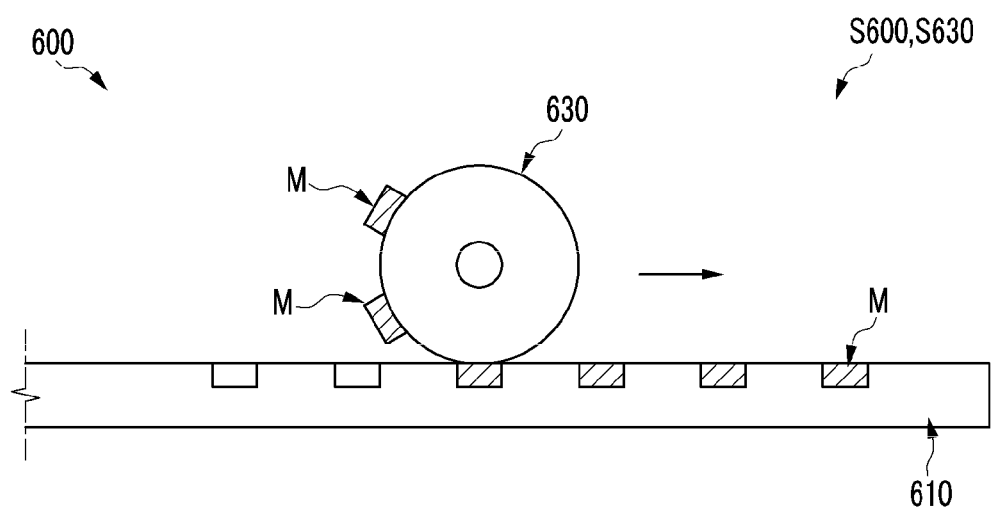
Figure 7C:
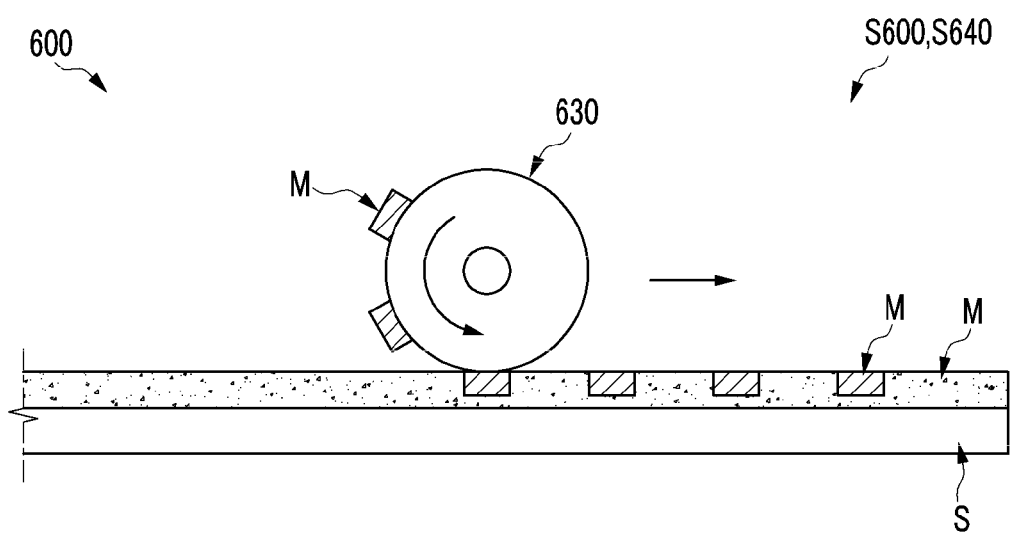

As shown in FIGS. 7A to 7C, the embodiment of the present invention provides a method S600 of burying a conductive mesh M in a transparent electrode E by a flatbed offset printing machine 600.

That is, the embodiment of the present invention provides a method S600 of burying a conductive mesh M in a transparent electrode E by a flatbed offset printing machine 600, the flatbed offset printing machine 600 including a flatbed 610 with a plurality of pattern recesses 611, serving as molds of the conductive mesh M buried in the transparent electrode E and forming a mesh form by crossing each other, and a roller 630 adapted to be brought into contact with the flatbed 610 to transfer the conductive mesh M to the substrate S.

To this end, first of all, the step S610 (hereinafter, referred to as the sixty-first step) of applying the conductive mesh M to the flatbed 610 and the step S620 (hereinafter, referred to as the sixty-second step) of filling the conductive mesh M in the pattern recesses 611 of the flatbed 610 by using a doctor blade DB are carried out (see FIG. 7A).

The sixty-first step S610 may be carried out using a dispenser D, as explained above.

Moreover, the liquid conductive mesh M applied by the dispenser D may be filled in the pattern recesses 611 of the flatbed 610 by the doctor blade DB.

Since this is a widely known technique, a detailed description thereof will be omitted.

After carrying out the sixty-first step S610 and the sixty-second step S620, the step S630 (hereinafter, referred to as the sixty-third step) of bringing the roller 630 into contact with the flatbed 610 to transfer the conductive mesh M filled in the pattern recesses 611 of the flatbed 610 to the roller 630 is carried out (see FIG. 7B).

At this point, a blanket (not shown) made of PDMS may be installed on the outer circumference of the roller 630, and then the conductive mesh M may be transferred to the conductive mesh M.

After carrying out the sixty-third step S630, the step S640 (hereinafter, referred to as the sixty-fourth step) of bringing the roller 630 into contact with the substrate S applied with the transparent electrode E so that the conductive mesh M transferred to the roller 630 is buried in the transparent electrode E on the substrate S is carried out. (see FIG. 7C)

By the method as above, it is possible to prevent the conductive mesh M from protruding from the transparent electrode E by burying the conductive mesh M in the transparent electrode E.

In the step sixty-fourth step S640, the transparent electrode E may be applied to the substrate S by spin coating or slit coating, as described above.

While this invention has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. A method for burying a conductive mesh in a transparent electrode by a gravure offset printing machine comprising a pattern roller with a plurality of recesses forming a mesh form by crossing each other, a blanket roller having a blanket made of polydimethylsiloxane adapted to be in contact with the pattern roller, and an impression roller to be brought into contact with the blanket roller, with a substrate interposed therebetween, the method comprising:
   filling a liquid conductive mesh in the recesses of the pattern roller;
   bringing the blanket roller into contact with the pattern roller to transfer the conductive mesh to the blanket roller; and
   passing the substrate applied with the transparent electrode between the blanket roller and the impression roller,
   wherein, in the passing of the substrate between the blanket roller and the impression roller, the blanket roller and the substrate are brought into contact with each other so that the conductive mesh transferred to the blanket roller is pressed by the blanket roller and buried in the transparent electrode on the substrate without protruding from the transparent electrode.

2. A method for burying a conductive mesh in a transparent electrode by a reverse gravure offset printing machine comprising a cliche with a plurality of protrusions forming a mesh form by crossing each other, a base applied with the conductive mesh in liquid form, and a blanket roller for transferring the conductive mesh to a substrate applied with the transparent electrode, the method comprising:
   applying a liquid conductive mesh to the base;
   bringing the blanket roller into contact with the base to transfer the conductive mesh to the blanket roller;
   bringing the blanket roller into contact with the cliche to transfer unnecessary portions of the conductive mesh to the protrusions; and
   bringing the blanket roller, by which the unnecessary portions of the conductive mesh are removed, into contact with the substrate applied with the transparent electrode,
   wherein, in the bringing of the blanket roller into contact with the substrate, the conductive mesh transferred to the blanket roller is pressed by the blanket roller and buried in the transparent electrode on the substrate.

3. A method for burying a conductive mesh in a transparent electrode by a flatbed offset printing machine comprising a flatbed with a plurality of pattern recesses forming a mesh form by crossing each other and a blanket roller adapted to be brought into contact with the flatbed to transfer the conductive mesh to a substrate, the method comprising:
   applying the conductive mesh to the flatbed;
   filling the conductive mesh in the pattern recesses of the flatbed by a doctor blade;
   bringing the blanket roller into contact with the flatbed to transfer the conductive mesh filled in the pattern recesses of the flatbed to the blanket roller; and
   bringing the blanket roller into contact with the substrate applied with the transparent electrode so that the conductive mesh transferred to the blanket roller is pressed by the blanket roller and buried in the transparent electrode on the substrate.

* * * * *